(12) United States Patent
Kato (10) Patent No.: US 7,944,989 B2
(45) Date of Patent: May 17, 2011

(54) QUADRATURE MODULATION APPARATUS, METHOD, PROGRAM, AND RECORDING MEDIUM

(75) Inventor: Takashi Kato, Saitama (JP)

(73) Assignee: Advantest Corporation, Tokyo (JP)

( * ) Notice: Subject to any disclaimer, the term of this patent is extended or adjusted under 35 U.S.C. 154(b) by 1080 days.

(21) Appl. No.: 10/578,006

(22) PCT Filed: Feb. 10, 2005

(86) PCT No.: PCT/JP2005/002509
§ 371 (c)(1),
(2), (4) Date: Aug. 3, 2006

(87) PCT Pub. No.: WO2005/081488
PCT Pub. Date: Sep. 1, 2005

(65) Prior Publication Data
US 2007/0140378 A1 Jun. 21, 2007

(30) Foreign Application Priority Data
Feb. 24, 2004 (JP) ................ P2004-048488

(51) Int. Cl.
*H04L 27/00* (2006.01)
*H04K 1/02* (2006.01)
*H04L 25/03* (2006.01)
*H04L 25/49* (2006.01)

(52) U.S. Cl. ........ 375/295; 330/149; 330/126; 330/151; 375/296; 375/298; 375/302

(58) Field of Classification Search .................. 375/302, 375/295, 296, 298; 330/149, 126, 151
See application file for complete search history.

(56) References Cited

U.S. PATENT DOCUMENTS 4,717,894 A 1/1988 Edwards et al.
(Continued)

FOREIGN PATENT DOCUMENTS

EP 1120944 8/2001
(Continued)

OTHER PUBLICATIONS

Vankka et al., "A Digital Quadrature Modulator With On-Chip D/A Converter", IEEE Journal of Solid-State Circuits, vol. 38, Issue 10, Oct. 2003, pp. 1635-1642.
(Continued)

*Primary Examiner* — David C. Payne
*Assistant Examiner* — Erin M File
(74) *Attorney, Agent, or Firm* — Greenblum & Bernstein, P.L.C.

(57) ABSTRACT

An RF signal, which has been obtained by a quadrature modulation, is corrected without performing quadrature demodulation. There are included an in-phase multiplier, a quadrature multiplier, an adder, a power detector, and an error determining part. The in-phase multiplier outputs an in-phase conversion signal by mixing an in-phase local signal of a predetermined local frequency with an in-phase correction user signal obtained by adding an in-phase user signal to an in-phase correction signal of a sinusoidal voltage outputted from an in-phase correction signal output unit. The quadrature multiplier outputs a quadrature conversion signal by mixing a quadrature local signal, which is different in phase by 90 degrees from the in-phase local signal, with a quadrature correction user signal obtained by adding a quadrature user signal to a quadrature correction signal, which is different in phase by 90 degrees from the in-phase correction signal, from a quadrature correction signal output unit. The adder adds the in-phase conversion signal to the quadrature conversion signal. The power detector measures an output voltage of the adder. The error determining part determines, based on the measurement result of the power detector, the error of the quadrature modulation.

4 Claims, 9 Drawing Sheets

U.S. PATENT DOCUMENTS

| | | | |
|---|---|---|---|
| 5,228,062 A * | 7/1993 | Bingham | 375/344 |
| 5,293,406 A | 3/1994 | Suzuki | |
| 5,847,619 A | 12/1998 | Kirisawa | |
| 6,294,952 B1 | 9/2001 | Kato | |
| 6,359,936 B1 | 3/2002 | Shyue | |
| 6,650,711 B1 | 11/2003 | Booth | |
| 7,158,586 B2 | 1/2007 | Husted | |
| 2003/0206603 A1 | 11/2003 | Husted | |
| 2005/0169402 A1* | 8/2005 | Niwa et al. | 375/298 |
| 2005/0226352 A1* | 10/2005 | Kasperkovitz | 375/346 |
| 2006/0133537 A1 | 6/2006 | Kato | |

FOREIGN PATENT DOCUMENTS

| | | |
|---|---|---|
| JP | 10-70581 | 3/1989 |
| JP | 5-68060 | 3/1993 |
| JP | 9-247225 | 9/1997 |
| JP | 2001-333120 | 11/2001 |
| JP | 2002-319989 | 10/2002 |
| TW | 444472 | 7/2001 |
| TW | 518859 | 1/2003 |
| TW | 200308159 A | 12/2003 |

OTHER PUBLICATIONS

U.S. Patent Application Publication No. 2006/0133537 to Kato, which was published on Jun. 22, 2006.

U.S. Appl. No. 10/571,527 to Kato, filed Mar. 10, 2006.

* cited by examiner

QUADRATURE MODULATION APPARATUS, METHOD, PROGRAM, AND RECORDING MEDIUM

TECHNICAL FIELD

The present invention relates to a correction of a quadrature modulator.

BACKGROUND ART

Figure 9:
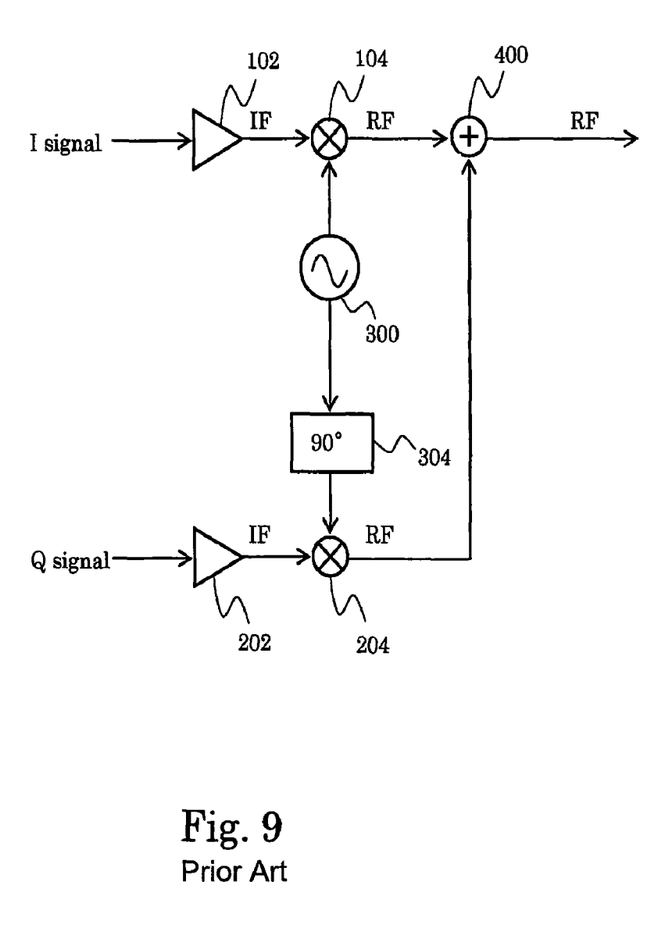
FIG. 9 shows a quadrature modulation circuit according to prior art.

It has conventionally been practiced to generate an RF (Radio Frequency) signal from an IF (Intermediate Frequency) signal by means of the quadrature modulation. FIG. 9 shows a quadrature modulation circuit according to prior art.

With reference to FIG. 9, IF signals include an I signal and a Q signal. The I signal is amplified by an amplifier 102. The amplified I signal is then mixed with a local signal generated by a local signal source 300 by a multiplier 104 to obtain an RF signal. The Q signal is amplified by an amplifier 202. The phase of the local signal generated by the local signal source 300 is shifted by 90 degrees by a phase shifter 304. The Q signal, which has been amplified by the amplifier 202, is mixed with the local signal whose phase has been shifted by 90 degrees by a multiplier 204 to obtain an RF signal. The output of the multiplier 104 is added to the output of the multiplier 204, and a result of the addition is then output as an RF signal by an adder 400.

On this occasion, it is difficult to maintain the difference in phase between the local signal supplied to the multiplier 104, and the local signal supplied to the multiplier 204 exactly to 90 degrees. Therefore, there is generated a phase error if the phase difference cannot be maintained exactly to 90 degrees. Moreover, since there are the two systems of the IF signals: the I signal and the Q signal, there may be generated a difference in the amplitude between the I signal and the Q signal, resulting in amplitude errors. It is thus necessary to remove the errors, namely to carry out corrections.

For the correction, there are provided signals used for the correction as the I signal and the Q signal. A signal output from the adder 400 as a result of the signals used for the correction being provided is demodulated by means of the quadrature demodulation to obtain IF signals, and the correction is carried out based upon a measurement result of the IF signals.

A patent document 1 (Japanese Laid-Open Patent Publication (Kokai) No. 2001-333120) describes a correction of a demodulator.

However, according to the correction according to the prior art, the RF signal obtained by means of the quadrature modulation has to be demodulated by means of the quadrature demodulation.

An object of the present invention is to correct an RF signal, which is obtained by means of the quadrature modulation, without carrying out the quadrature demodulation.

DISCLOSURE OF THE INVENTION

According to the present invention, a quadrature modulation apparatus includes: an in-phase signal converting unit that outputs an in-phase conversion signal by mixing an in-phase local signal of a predetermined local frequency with an in-phase correction user signal obtained by adding an in-phase user signal to an in-phase correction signal of a sinusoidal voltage; a quadrature signal converting unit that outputs a quadrature conversion signal by mixing a quadrature local signal which is different in phase by 90 degrees from the in-phase local signal, with a quadrature correction user signal obtained by adding a quadrature user signal to a quadrature correction signal, which is different in phase by 90 degrees from the in-phase correction signal; an adding unit that adds the in-phase conversion signal to the quadrature conversion signal; an output voltage measuring unit that measures an output voltage of the adding unit; and an error determining unit that determines an error of the quadrature modulation based upon the measurement result of the output voltage measuring unit.

According to the thus constructed invention, an in-phase signal converting unit outputs an in-phase conversion signal by mixing an in-phase local signal of a predetermined local frequency with an in-phase correction user signal obtained by adding an in-phase user signal to an in-phase correction signal of a sinusoidal voltage. A quadrature signal converting unit outputs a quadrature conversion signal by mixing a quadrature local signal which is different in phase by 90 degrees from the in-phase local signal, with a quadrature correction user signal obtained by adding a quadrature user signal to a quadrature correction signal, which is different in phase by 90 degrees from the in-phase correction signal. An adding unit adds the in-phase conversion signal to the quadrature conversion signal. An output voltage measuring unit measures an output voltage of the adding unit. An error determining unit determines an error of the quadrature modulation based upon the measurement result of the output voltage measuring unit.

According to the present invention, it is preferable that the error determining unit may measure the error of the quadrature modulation based upon a relationship of the output voltage of the adding unit with respect to the phase of the in-phase correction signal or the quadrature correction signal.

According to the present invention, it is preferable that the error determining unit may determine an error relating to an amplitude, an orthogonality, and an offset of the in-phase user signal and the quadrature user signal.

According to the present invention, a quadrature modulation apparatus includes: a signal converting unit that outputs a conversion signal by mixing a local signal of a predetermined local frequency with an offset user signal obtained by adding a DC voltage signal to a user signal; an output voltage measuring unit that measures a voltage of the conversion signal; and an optimum voltage deciding unit that decides an optimum voltage such that the voltage measured by the output voltage measuring unit is minimum.

According to the thus constructed invention, a signal converting unit outputs a conversion signal by mixing a local signal of a predetermined local frequency with an offset user signal obtained by adding a DC voltage signal to a user signal. An output voltage measuring unit measures a voltage of the conversion signal. An optimum voltage deciding unit decides an optimum voltage such that the voltage measured by the output voltage measuring unit is minimum.

According to the present invention, a quadrature modulation method includes: an in-phase signal converting step of outputting an in-phase conversion signal by mixing an in-phase local signal of a predetermined local frequency with an in-phase correction user signal obtained by adding an in-phase user signal to an in-phase correction signal of a sinusoidal voltage; a quadrature signal converting step of outputting a quadrature conversion signal by mixing a quadrature local signal which is different in phase by 90 degrees from the in-phase local signal, with a quadrature correction user signal obtained by adding a quadrature user signal to a quadrature correction signal, which is different in phase by 90 degrees from the in-phase correction signal; an adding step of adding the in-phase conversion signal to the quadrature conversion signal; an output voltage measuring step of measuring an output voltage of the adding step; and an error determining step of determining an error of the quadrature modulation based upon the measurement result of the output voltage measuring step.

According to the present invention, a quadrature modulation method includes: a signal converting step of outputting a conversion signal by mixing a local signal of a predetermined local frequency with an offset user signal obtained by adding a DC voltage signal to a user signal; an output voltage measuring step of measuring a voltage of the conversion signal; and an optimum voltage deciding step of deciding an optimum voltage such that the voltage measured by the output voltage measuring step is minimum.

The present invention is a program of instructions for execution by the computer to perform a processing of a quadrature modulation apparatus including: an in-phase signal converting unit that outputs an in-phase conversion signal by mixing an in-phase local signal of a predetermined local frequency with an in-phase correction user signal obtained by adding an in-phase user signal to an in-phase correction signal of a sinusoidal voltage; a quadrature signal converting unit that outputs a quadrature conversion signal by mixing a quadrature local signal which is different in phase by 90 degrees from the in-phase local signal, with a quadrature correction user signal obtained by adding a quadrature user signal to a quadrature correction signal, which is different in phase by 90 degrees from the in-phase correction signal; an adding unit that adds the in-phase conversion signal to the quadrature conversion signal; and an output voltage measuring unit that measures an output voltage of the adding unit, the processing including: an error determining step of determining an error of the quadrature modulation based upon the measurement result of the output voltage measuring unit.

The present invention is a program of instructions for execution by the computer to perform a processing of a quadrature modulation apparatus including: a signal converting unit that outputs a conversion signal by mixing a local signal of a predetermined local frequency with an offset user signal obtained by adding a DC voltage signal to a user signal; and an output voltage measuring unit that measures a voltage of the conversion signal, the processing including: an optimum voltage deciding step of deciding an optimum voltage such that the voltage measured by the output voltage measuring unit is minimum.

The present invention is a computer-readable medium having a program of instructions for execution by the computer to perform a processing of a quadrature modulation apparatus including: an in-phase signal converting unit that outputs an in-phase conversion signal by mixing an in-phase local signal of a predetermined local frequency with an in-phase correction user signal obtained by adding an in-phase user signal to an in-phase correction signal of a sinusoidal voltage; a quadrature signal converting unit that outputs a quadrature conversion signal by mixing a quadrature local signal which is different in phase by 90 degrees from the in-phase local signal, with a quadrature correction user signal obtained by adding a quadrature user signal to a quadrature correction signal, which is different in phase by 90 degrees from the in-phase correction signal; an adding unit that adds the in-phase conversion signal to the quadrature conversion signal; and an output voltage measuring unit that measures an output voltage of the adding unit, the processing including: an error determining step of determining an error of the quadrature modulation based upon the measurement result of the output voltage measuring unit.

The present invention is a computer-readable medium having a program of instructions for execution by the computer to perform a processing of a quadrature modulation apparatus including: a signal converting unit that outputs a conversion signal by mixing a local signal of a predetermined local frequency with an offset user signal obtained by adding a DC voltage signal to a user signal; and an output voltage measuring unit that measures a voltage of the conversion signal, the processing including: an optimum voltage deciding step of deciding an optimum voltage such that the voltage measured by the output voltage measuring unit is minimum.

BEST MODE FOR CARRYING OUT THE INVENTION

A description will now be given of an embodiment of the present invention with reference to drawings.

Figure 1:
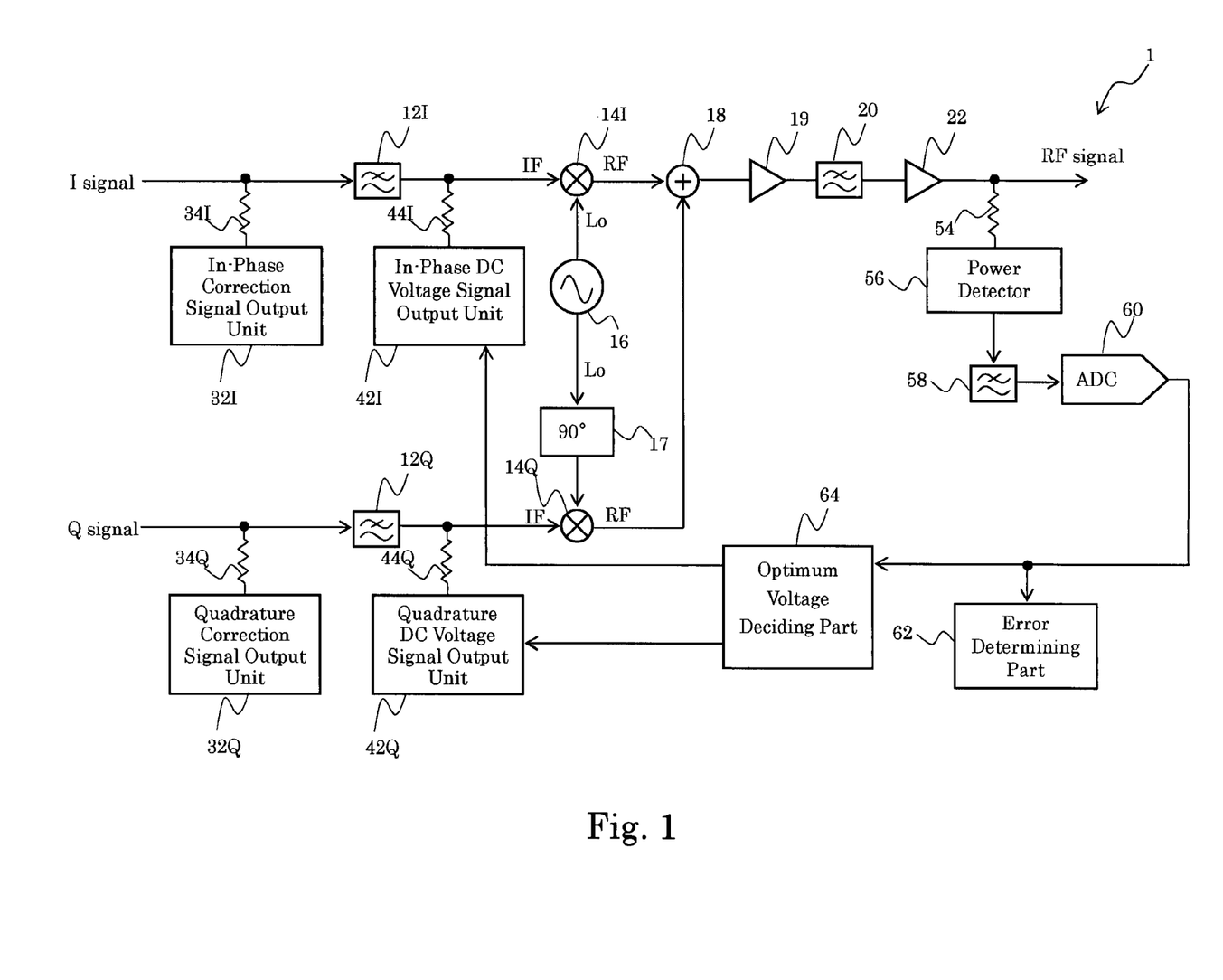
FIG. 1 is a functional block diagram showing a configuration of a quadrature modulation apparatus 1 according an embodiment of the present invention.

FIG. 1 is a functional block diagram showing a configuration of a quadrature modulation apparatus 1 according the embodiment of the present invention. The quadrature modulation apparatus 1 is provided with low-pass filters 12I, 12Q, an in-phase multiplier (in-phase signal converting means) 14I, a quadrature multiplier (quadrature signal converting means) 14Q, a local oscillator 16, a 90° phase shifter 17, an adder 18, an amplifier 19, a low-pass filter 20, and an amplifier 22.

The low-pass filter 12I is a filter which removes a higher harmonic component mixed in an I signal (in-phase user signal). The low-pass filter 12Q is a filter which removes a higher harmonic component mixed in a Q signal (quadrature user signal).

The in-phase multiplier (in-phase signal converting means) 14I outputs an in-phase conversion signal by mixing an output of the local oscillator 16 with an output of the low-pass filter 12I.

The quadrature multiplier (quadrature signal converting means) 14Q outputs a quadrature conversion signal by mixing an output of the 90° phase shifter 17 with an output of the low-pass filter 12Q.

The local oscillator 16 generates an in-phase local signal Lo.

The 90° phase shifter 17 receives the in-phase local signal Lo from the local oscillator 16, and outputs the quadrature local signal which is obtained by shifting the phase of the in-phase local signal Lo by 90°.

The adder 18 adds the in-phase conversion signal output from the in-phase multiplier 14I to the quadrature conversion signal output from the quadrature multiplier 14Q.

The amplifier 19 amplifies the output from the adder 18.

The low-pass filter 20 is a filter which removes a higher harmonic component mixed in an output from the multiplier 19.

The amplifier 22 amplifies an output of the low-pass filter 20. An output of the amplifier 22 is an RF signal. This RF signal is a modulated signal obtained by modulating the I signal and the Q signal. The modulated signal includes errors caused by the quadrature modulation by the in-phase multiplier 14I and the quadrature multiplier 14Q. Therefore, it is desirable to correct the modulated signal by removing the errors.

For the correction of the modulated signal, the quadrature modulation apparatus 1 is further provided with an in-phase correction signal output unit 32I, a resistor 34I, a quadrature correction signal output unit 32Q, a resistor 34Q, an in-phase DC voltage signal output unit 42I, a resistor 44I, a quadrature DC voltage signal output unit 42Q, a resistor 44Q, a resistor 54, a power detector (output voltage measuring means) 56, a low-pass filter 58, an A/D converter 60, an error determining part 62, and an optimum voltage deciding part 64.

Figure 2:
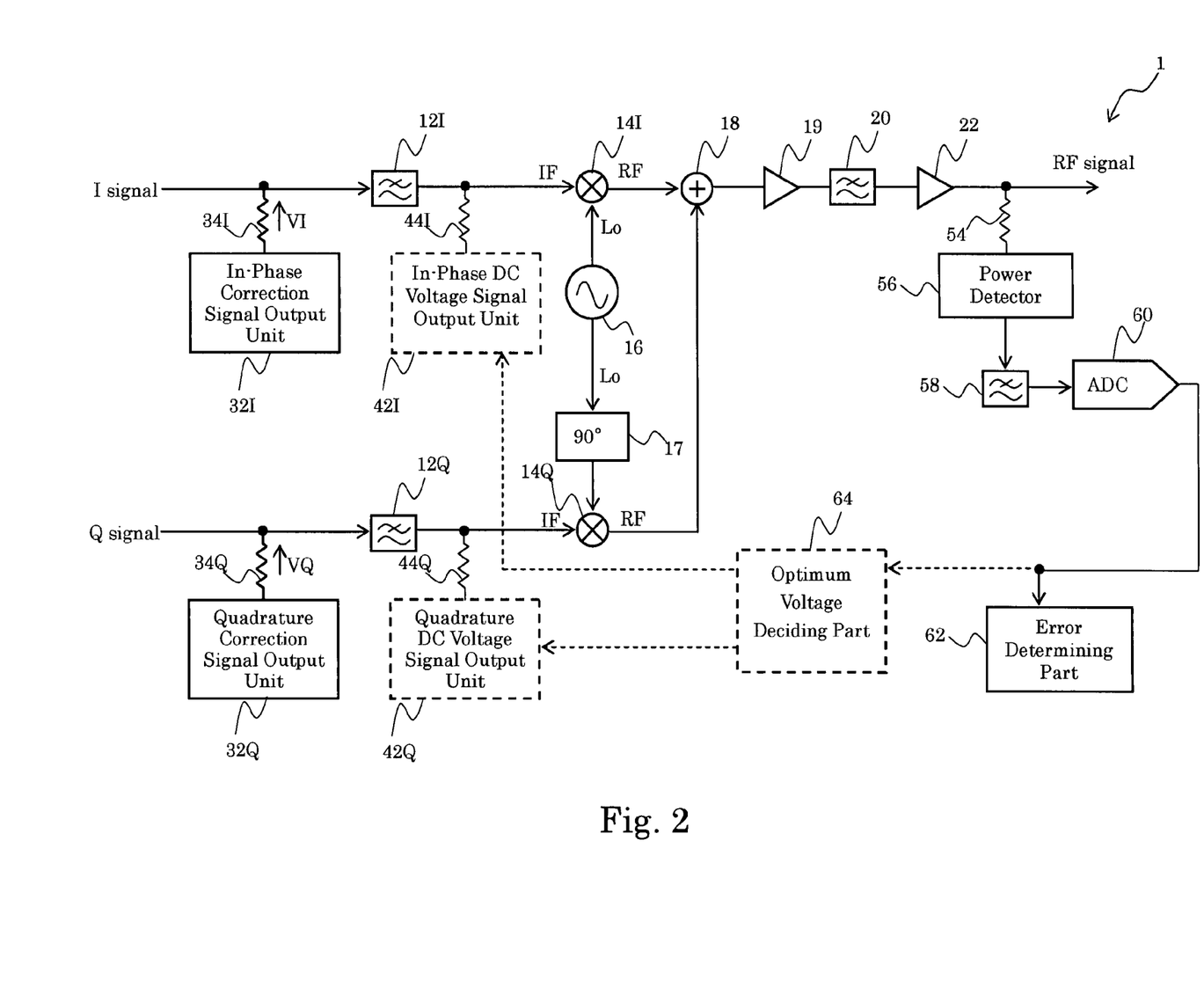
FIG. 2 is a functional block diagram showing a configuration of the quadrature modulation apparatus 1 upon the in-phase correction signal output unit 32I and the quadrature correction signal output unit 32Q being caused to operate.

FIG. 2 is a functional block diagram showing a configuration of the quadrature modulation apparatus 1 upon the in-phase correction signal output unit 32I and the quadrature correction signal output unit 32Q being caused to operate. On this occasion, the in-phase DC voltage signal output unit 42I, the quadrature DC voltage signal output unit 42Q, and the optimum voltage deciding part 64 are caused not to operate.

The in-phase correction signal output unit 32I adds an in-phase correction signal VI to the I signal via the resistor 34I. The quadrature correction signal output unit 32Q adds a quadrature correction signal VQ to the Q signal via the resistor 34Q.

Figure 3:
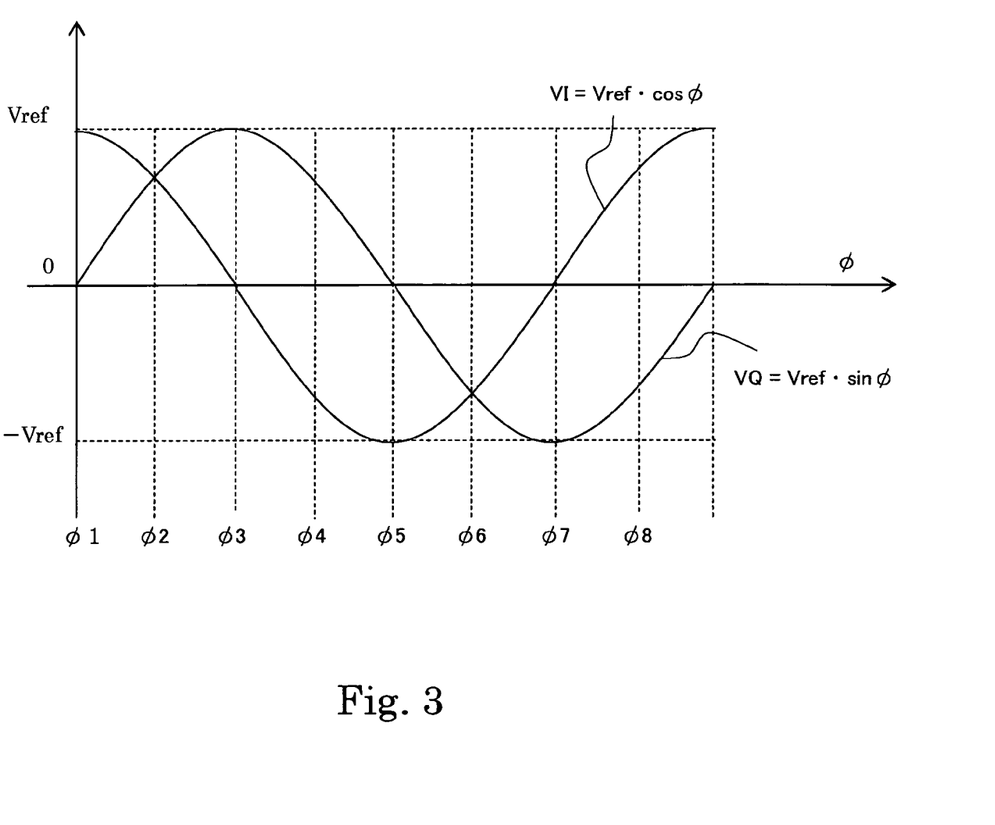
FIG. 3 is a diagram showing waveforms of the in-phase correction signal VI and the quadrature correction signal VQ.

Waveforms of the in-phase correction signal VI and the quadrature correction signal VQ are shown in FIG. 3. The in-phase correction signal and the quadrature correction signal are respectively represented as $VI=Vref \cdot \cos \theta$, and $VQ=Vref \cdot \sin \theta$. The phase of the in-phase correction signal VI and the phase of the quadrature correction signal VQ are different from each other by 90 degrees. It should be noted that only values at $\phi n=45° \times (n-1)$ (n: an integer from 1 to 8) may be used as the in-phase correction signal VI and the quadrature correction-signal VQ, each of which has a voltage in form of a sinusoidal wave. For example, (VI, VQ) may be changed as (Vref, 0), (0.5√2Vref, 0.5√2Vref), (0, Vref), . . . .

The low-pass filter 12I removes a higher harmonic component mixed in an in-phase correction user signal obtained by adding the in-phase correction signal VI to the I signal (in-phase user signal). The low-pass filter 12Q removes a higher harmonic component mixed in a quadrature correction user signal obtained by adding the quadrature correction signal VQ to the Q signal (quadrature user signal).

The in-phase multiplier 14I, the quadrature multiplier 14Q, the local oscillator 16, the 90° phase shifter 17, the adder 18, the amplifier 19, the low-pass filter 20, and the amplifier 22 operate as described with reference to FIG. 1.

The register 54 receives the output of the amplifier 22.

The power detector (output voltage measuring means) 56 receives the output of the amplifier 22 via the register 54, and then measures the voltage. A description will now be given of the output voltage of the amplifier 22 measured by the power detector 56. This voltage measurement is to measure the output voltage of the adder 18.

First, it is assumed that the voltage of the in-phase correction signal VI is represented as I, and the voltage of the quadrature correction signal VQ is represented as Q. If the output of the amplifier 22 is represented as r(t), and an IQ quadrature phase error is represented as θ, r(t) is represented as:

$$r(t)=I \cos \omega t + Q \sin(\omega t + \theta) = (I + Q \sin \theta) \cos \omega t + (Q \cos \theta) \sin \omega t$$

The output voltage V of the amplifier 22 measured by the power detector 56 is determined by an amplitude of r(t), and is thus represented as:

$$V=((I+Q \sin \theta)^2+(Q \cos \theta)^2)^{1/2}$$

On this occasion, if amplitude errors caused by the in-phase multiplier 14I and the quadrature multiplier 14Q are respectively represented as i and q, I is represented as $i \cdot Vref \cdot \cos \phi$, and Q is represented as $q \cdot Vref \cdot \sin \phi$. If Vref=1, the output voltage V is then represented as:

$$V=((i \cos \phi + q \sin \phi \sin \theta)^2 + (q \sin \phi \cos \theta)^2)^{1/2}$$

If the IQ quadrature phase error θ=0, and i=q=1.0 (no amplitude errors), the output voltage V is then represented as:

$$V=((i \cos \phi)^2+(q \sin \phi)^2)^{1/2}=((\cos \phi)^2+(\sin \phi)^2)^{1/2}=1.0$$

Figure 4:
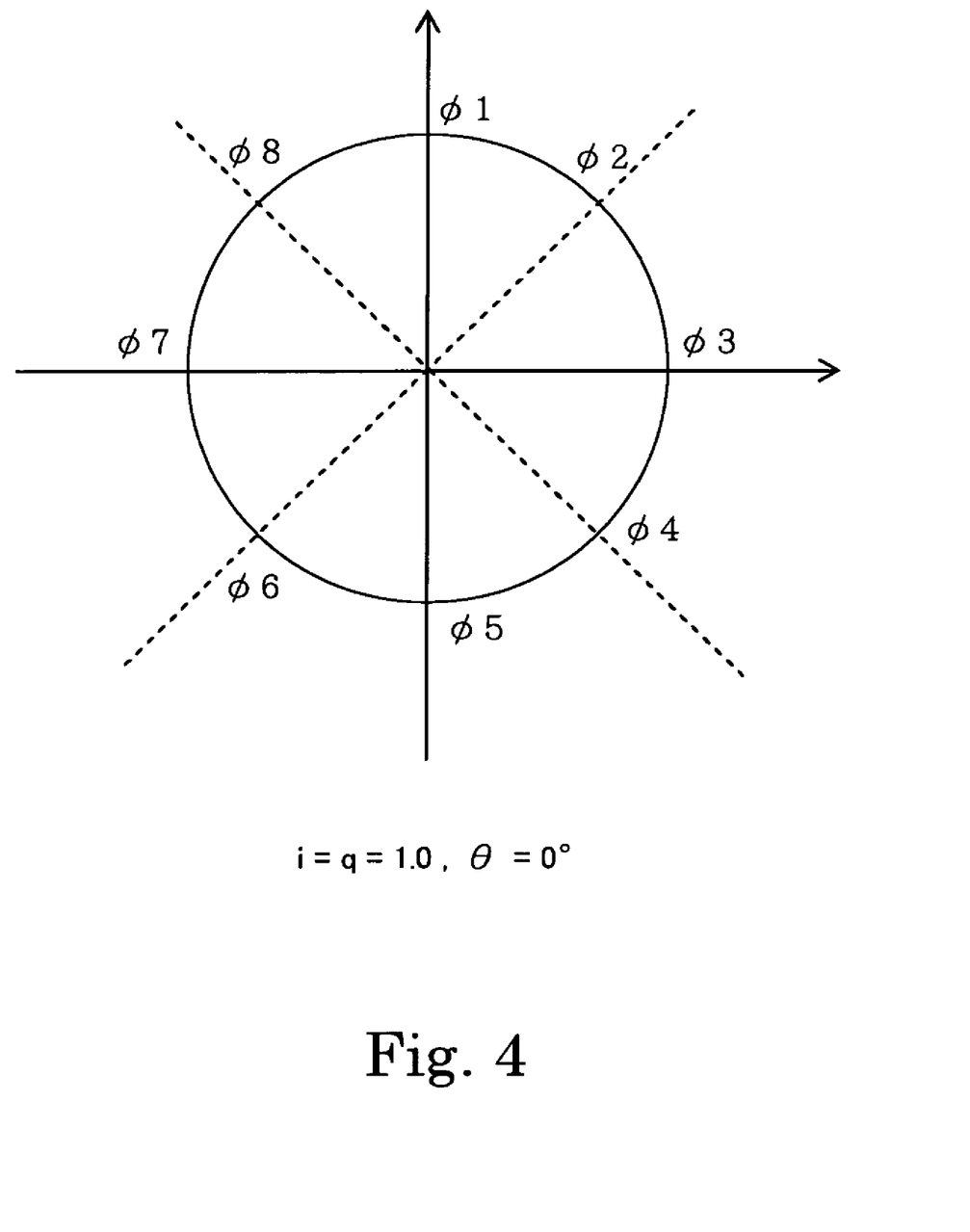
FIG. 4 shows a relationship between the output voltage V and the phase $\phi$ (phase of the in-phase correction signal VI and the quadrature correction signal VQ) of the amplifier 22 if $\theta=0$, and $i=q=1.0$ (no errors)

FIG. 4 shows a relationship between the output voltage V and the phase φ (phase of the in-phase correction signal VI and the quadrature correction signal VQ) of the amplifier 22 if θ=0, and i=q=1.0 (no errors). In FIG. 4, the voltage V is represented by a distance from the origin, and the phase φ is represented as an angle with respect to a vertical axis (note that the angle increases clockwise). As shown in FIG. 4, if there are no errors, a trajectory of the voltage V presents a perfect circle with a radius of 1.0 about the origin.

However, if there are the amplitude errors, the voltage V presents an ellipsoidal trajectory, if there is further the IQ quadrature phase error θ, the ellipsoid is tilted, and if there are still further offset errors caused by the in-phase multiplier 14I and the quadrature multiplier 14Q, the center of the ellipsoid is deviated from the origin.

Figure 5:
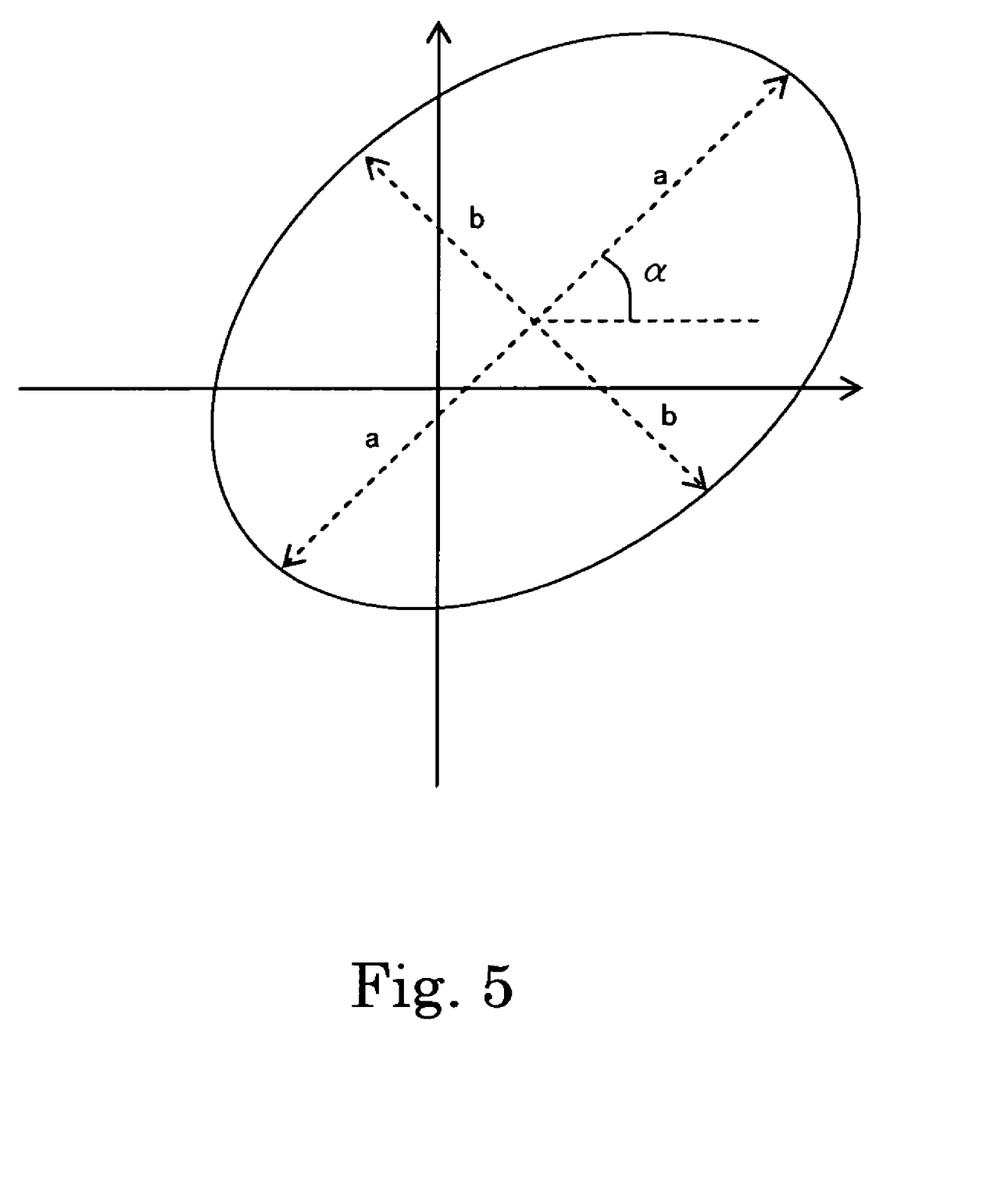
FIG. 5 is a diagram showing a general trajectory of the voltage V.

Thus, the trajectory of the voltage V generally presents a tilted ellipsoid deviated from the origin as shown in FIG. 5.

The low-pass filter 58 removes a higher harmonic component mixed in an output of the power detector 56.

The A/D converter 60 converts an output (which is an analog signal) of the low-pass filter 58 into a digital signal.

The error determining part 62 determines the errors of the quadrature modulation based upon the output of the A/D converter 60.

The trajectory of the voltage V as shown in FIG. 5 is obtained based upon the output of the A/D converter 60. It should be noted that the trajectory of the voltage V shown in FIG. 5 has a length of the major axis 2a, a length of a minor axis 2b, and a tilt angle of the axes α. Therefore, it is possible to determine the amplitude error i of the I signal and the amplitude error q of the Q signal based upon the lengths of the major axis and the minor axis of the trajectory (ellipsoid) of the voltage V as shown in FIG. 5. Moreover, it is possible to determine the IQ quadrature phase error θ based upon the tilt of the trajectory (ellipsoid) of the voltage V. Further, it is possible to determine the offsets of the I signal and the Q signal based upon the deviations of the center of the trajectory (ellipsoid) of the voltage V in the directions of the horizontal axis and the vertical axis.

Following values may be obtained as errors derived from these errors.

Figure 6:
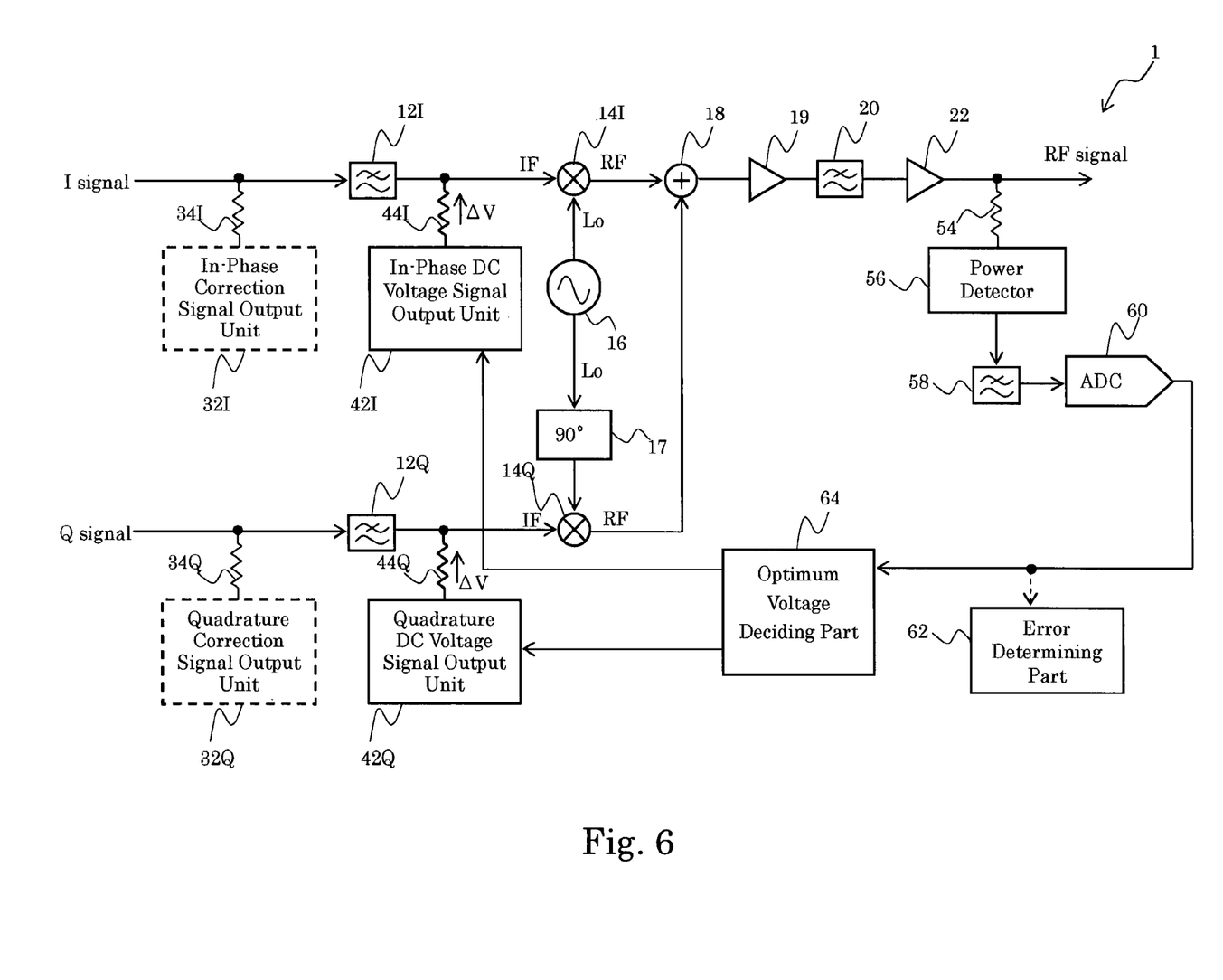
FIG. 6 is a functional block diagram showing a configuration of the quadrature modulation apparatus 1 upon the in-phase DC voltage signal output unit 42I being caused to operate.

Image rejection A: $(a-b)/(a+b)$
Gain error G: $(1+A^2-2A\cos(2\alpha))/(1+A^2+2A\cos(2\alpha))$
Phase error: $\arc\tan((2A\sin(2\alpha))/(1-A^2))$ FIG. 6 is a functional block diagram showing a configuration of the quadrature modulation apparatus 1 upon the in-phase DC voltage signal output unit 42I being caused to operate. On this occasion, all the in-phase correction signal output unit 32I, the quadrature correction signal output unit 32Q, the quadrature DC voltage signal output unit 42Q, and the error determining part 62 are caused not to operate.

The in-phase DC voltage signal output unit 42I generates an offset user signal by adding a DC voltage signal (voltage: $\Delta v$) to the output of the low-pass filter 12I via the resistor 44I. The in-phase multiplier 14I outputs a conversion signal by mixing the output of the local oscillator 16 with the offset user signal. It should be noted that a local signal is not supplied to the quadrature multiplier 14Q. As a result, a signal is not output from the quadrature multiplier 14Q.

The local oscillator 16, the 90° phase shifter 17, the adder 18, the amplifier 19, the low-pass filter 20, and the amplifier 22 operate as described with reference to FIG. 1.

The register 54 receives the output of the amplifier 22.

The power detector 56 receives the output of the amplifier 22 via the register 54, and then measures the voltage. This voltage measurement is to measure the voltage of the conversion signal output from the in-phase multiplier 14I. A description will now be given of the output voltage of the amplifier 22 measured by the power detector 56.

Figure 7:
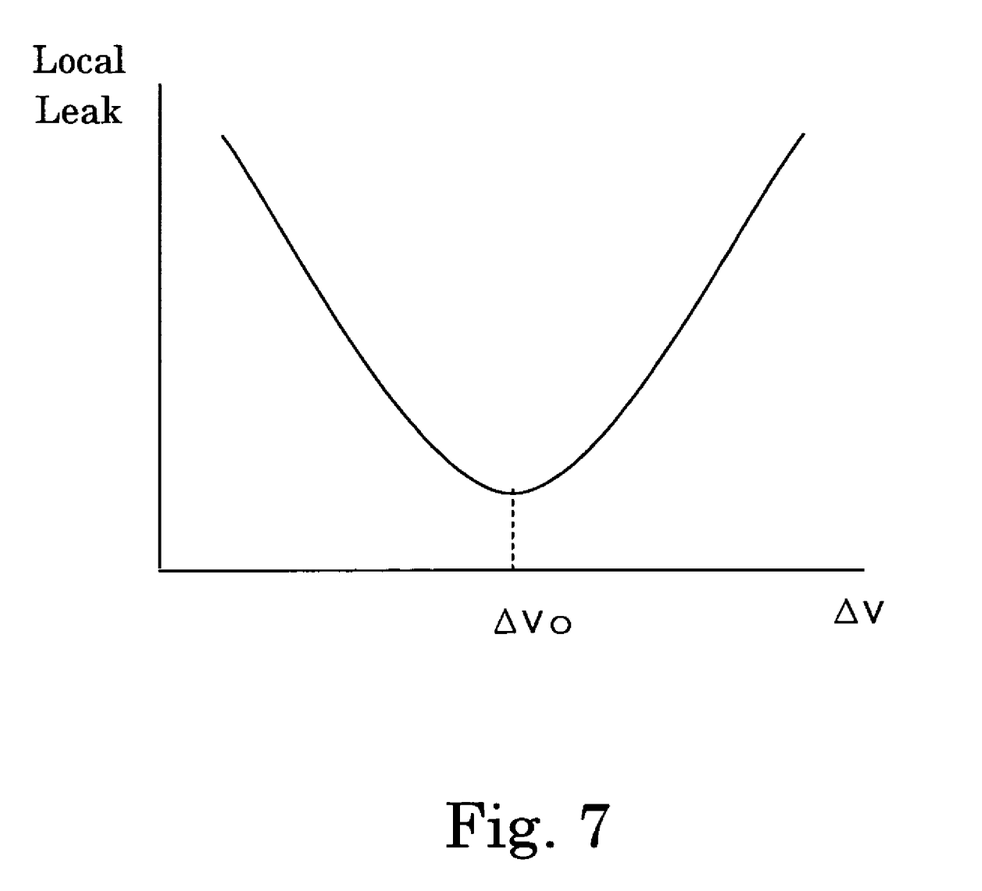
FIG. 7 shows a relationship between the voltage $\Delta V$ of the DC voltage signal and the local leak.

The output voltage of the amplifier 22 measured by the power detector 56 is a local leak of the in-phase multiplier 14I. The local leak is a type of an error, and it is desirable that the local leak is small. On this occasion, the local leak varies according to the voltage $\Delta V$ of the DC voltage signal. Namely, as shown in FIG. 7, the local leak takes the minimum value at $\Delta V=\Delta Vo$. $\Delta Vo$ is referred to as an optimum voltage. If the $\Delta Vo$ is supplied in order to minimize the local leak, the linearity of the in-phase multiplier (mixer) 14I becomes optimum.

The optimum voltage deciding part 64 decides the optimum voltage $\Delta Vo$ based upon the output of the A/D converter 60. The optimum voltage deciding part 64 then controls the in-phase DC voltage signal output unit 42I so that $\Delta V=\Delta Vo$. The in-phase DC voltage signal output unit 42I adds an optimum DC voltage signal (voltage $\Delta V=\Delta Vo$) to the I signal which has passed the low-pass filter 12I.

It should be noted that a local leak of the quadrature multiplier 14Q can be reduced in a similar manner. Namely, the quadrature DC voltage signal output unit 42Q is caused to operate, the in-phase correction signal output unit 32I, the quadrature correction signal output unit 32Q, the in-phase DC voltage signal output unit 42I, and the error determining part 62 are caused not to operate, further a local signal is not supplied to the in-phase multiplier 14I, and the optimum voltage deciding part 64 decides a value of $\Delta V$ which minimizes the local leak (optimum voltage $\Delta Vo$) based upon the output of the A/D converter 60. The optimum voltage deciding part 64 then controls the quadrature DC voltage signal output unit 42Q so that $\Delta V=\Delta Vo$. The quadrature DC voltage signal output unit 42Q adds an optimum DC voltage signal (voltage $\Delta V=\Delta Vo$) to the Q signal which has passed the low-pass filter 12Q.

Figure 8:
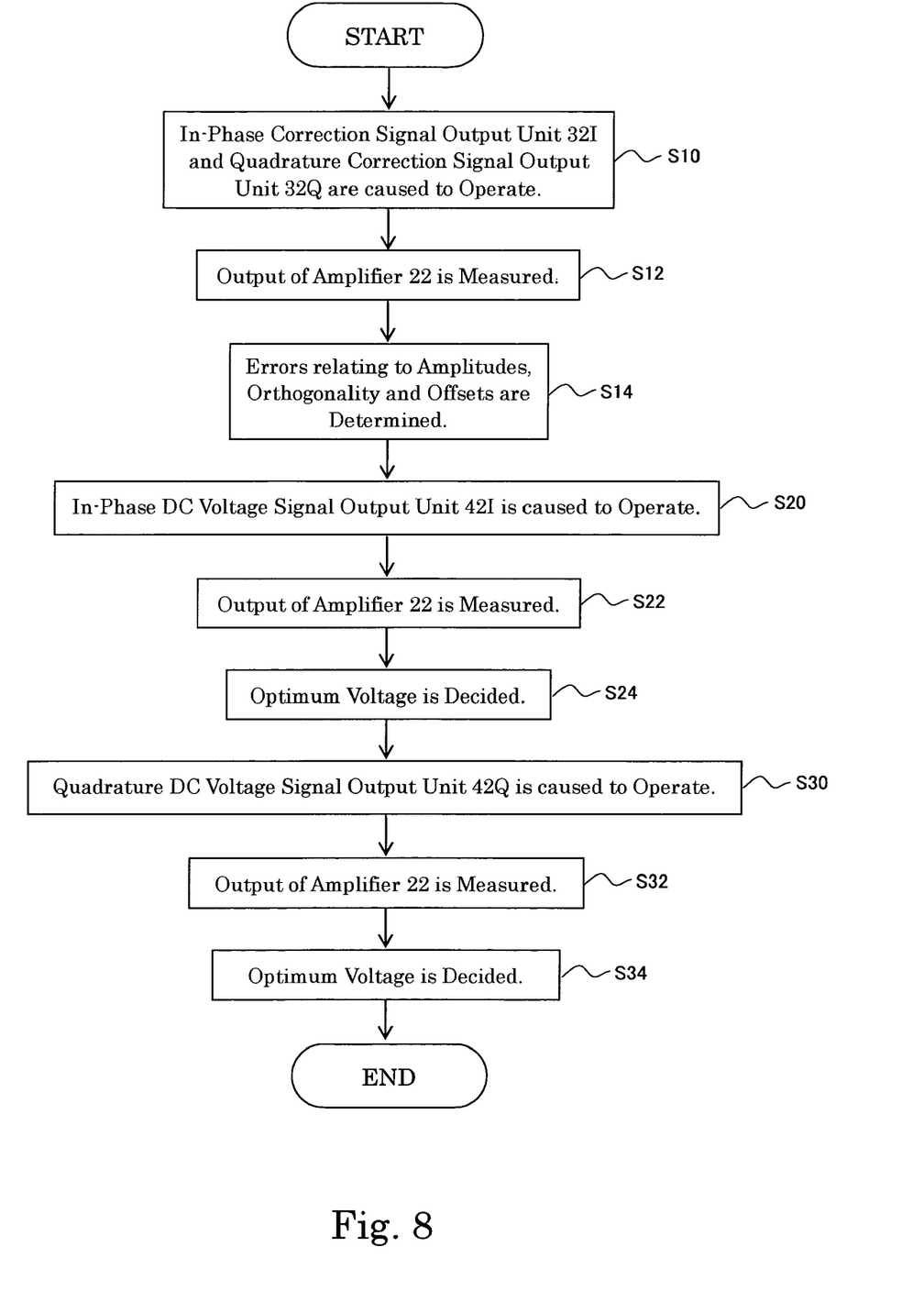
FIG. 8 shows a flowchart showing an operation of the embodiment of the present invention.

A description will now be given of an operation of the embodiment of the present invention with reference to a flow-chart in FIG. 8.

First, the in-phase correction signal output unit 32I and the quadrature correction signal output unit 32Q are caused to operate (S10) (Refer to FIG. 2).

As a result, the in-phase correction user signal is obtained by adding the in-phase correction signal VI output from the in-phase correction signal output unit 32I to the I signal (in-phase user signal). The higher harmonic component mixed in the in-phase correction user signal is removed by the low-pass filter 12I. Then, the in-phase correction user signal is mixed with the output of the local oscillator 16 by the in-phase multiplier 14I to obtain the in-phase conversion signal.

Moreover, the quadrature correction user signal is obtained by adding the quadrature correction signal VQ output from the quadrature correction signal output unit 32Q to the Q signal (quadrature user signal). The higher harmonic component mixed in the quadrature correction user signal is removed by the low-pass filter 12Q. Then, the quadrature correction user signal is mixed with the output of the 90° phase shifter 17 by the quadrature multiplier 14Q to obtain the quadrature conversion signal.

The in-phase conversion signal is added to the quadrature conversion signal by the adder 18. Further, the output of the adder 18 is amplified by the amplifier 19. The mixed higher harmonic component is removed from the output of the amplifier 19 by the low-pass filter 20, and the output is then amplified by the amplifier 22. The output of the amplifier 22 is the RF signal.

The RF signal is supplied to the power detector 56 via the resistor 54. The power detector 56 measures the output voltage of the amplifier 22 (S12).

The higher harmonic component is removed from the measurement result by the low-pass filter 58, and the measurement result is then converted into the digital signal by the A/D converter 60, and is then supplied to the error determining part 62.

The error determining part 62 determines the errors relating to the amplitudes, the orthogonality, and the offsets (including the image rejection, the gain error, and the phase error) based upon the relationship between the output voltage V and the phase $\phi$ (the phase of the in-phase correction signal VI and the quadrature correction signal VQ) of the amplifier 22 (refer to FIGS. 4 and 5) (S14).

The errors obtained in this manner can be removed upon the quadrature modulation being carried out by the in-phase multiplier 14I and the quadrature multiplier 14Q.

The in-phase DC voltage signal output unit 42I is then caused to operate (S20) (refer to FIG. 6).

The mixed higher harmonic component is removed from the I signal (in-phase user signal) by the low-pass filter 12I, and the DC voltage signal (voltage: $\Delta V$) output from the in-phase DC voltage signal output unit 42I is then added to the I signal to obtain the offset user signal. The in-phase multiplier 14I outputs the conversion signal by mixing the output of the local oscillator 16 with the offset user signal.

The conversion signal passes the adder 18 (no signal is output from the quadrature multiplier 14Q). Further, the output of the adder 18 is amplified by the amplifier 19. The mixed higher harmonic component is removed from the output of the amplifier 19 by the low-pass filter 20, and the output is then amplified by the amplifier 22.

The output of the amplifier 22 is supplied to the power detector 56 via the resistor 54. The power detector 56 measures the output voltage of the amplifier 22 (S22). This measurement result is the local leak of the in-phase multiplier 14I.

The higher harmonic component is removed from the measurement result by the low-pass filter 58, and the measurement result is then converted into the digital signal by the A/D converter 60, and is supplied to the optimum voltage deciding part 64. The optimum voltage deciding part 64 decides the value of ΔV which minimizes the local leak, namely the optimum voltage ΔVo (refer to FIG. 7) (S24).

The quadrature DC voltage signal output unit 42Q is then caused to operate (S30).

The mixed higher harmonic component is removed from the Q signal (quadrature user signal) by the low-pass filter 12Q, and the DC voltage signal (voltage: ΔV) output from the quadrature DC voltage signal output unit 42Q is then added to the Q signal to obtain the offset user signal. The quadrature multiplier 14Q outputs the conversion signal by mixing the output of the 90° phase shifter 17 with the offset user signal.

The conversion signal passes the adder 18 (no signal is output from the in-phase multiplier 14I). Further, the output of the adder 18 is amplified by the amplifier 19. The mixed higher harmonic component is removed from the output of the amplifier 19 by the low-pass filter 20, and the output is then amplified by the amplifier 22.

The output of the amplifier 22 is supplied to the power detector 56 via the resistor 54. The power detector 56 measures the output voltage of the amplifier 22 (S32). This measurement result is the local leak of the quadrature multiplier 14Q.

The higher harmonic component is removed from the measurement result by the low-pass filter 58, and the measurement result is then converted into the digital signal by the A/D converter 60, and is then supplied to the optimum voltage deciding part 64. The optimum voltage deciding part 64 decides the value of ΔV which minimizes the local leak, namely the optimum voltage ΔVo (refer to FIG. 7) (S34).

The optimum voltage deciding part 64 causes the in-phase DC voltage signal output unit 42I to output the optimum DC voltage signal of the optimum voltage ΔVo decided for the in-phase multiplier 14I. Moreover, the optimum voltage deciding part 64 causes the quadrature DC voltage signal output unit 42Q to output the optimum DC voltage signal of the optimum voltage ΔVo decided for the quadrature multiplier 14Q. As a result, it is possible to restrain the local leaks of the in-phase multiplier 14I and the quadrature multiplier 14Q upon the quadrature modulation being carried out by the in-phase multiplier 14I and the quadrature multiplier 14Q.

According to the embodiment of the present invention, the error determining part 62 can determine the amplitude errors, the IQ quadrature phase error, and the offsets based upon the measurement result of the voltage of the RF signal obtained by means of the quadrature modulation. It is thus possible to correct the RF signal without the quadrature demodulation.

Moreover, the optimum voltage deciding part 64 can decide the voltage ΔVo (optimum voltage) of the DC voltage signal which can minimize the local leaks of the in-phase multiplier 14I and the quadrature multiplier 14Q based upon the measurement results of the voltage of the RF signals obtained by means of the quadrature modulation. It is thus possible to correct the RF signal without the quadrature demodulation.

Moreover, the above-described embodiment may be realized in the following manner. Namely, a computer is provided with a CPU, a hard disk, and a media (such as a floppy disk (registered trade mark) and a CD-ROM) reader, and the media reader is caused to read a medium recording a program realizing the above-described respective parts (such as the error determining part 62 and the optimum voltage deciding part 64), thereby installing the program upon the hard disk. This method may also realize the above-described embodiment.

The invention claimed is:

1. A quadrature modulation apparatus, comprising:
    an in-phase correction signal outputter that generates an in-phase correction user signal by adding an in-phase user signal to an in-phase correction signal of a sinusoidal voltage;
    an in-phase signal outputter that generates an in-phase offset user signal by adding an in-phase voltage signal to the in-phase correction user signal;
    an in-phase signal converter that outputs an in-phase conversion signal by mixing an in-phase local signal of a predetermined local frequency with the in-phase offset user signal;
    a quadrature correction signal outputter that generates a quadrature correction user signal by adding a quadrature user signal to a quadrature correction signal, which is different in phase by approximately 90 degrees from the in-phase correction signal;
    a quadrature signal outputter that generates a quadrature offset user signal by adding a quadrature voltage signal to the quadrature correction user signal;
    a quadrature signal converter that outputs a quadrature conversion signal by mixing a quadrature local signal, which is different in phase by approximately 90 degrees from the in-phase local signal, with the quadrature offset user signal;
    an adder that adds the in-phase conversion signal to the quadrature conversion signal;
    an output voltage measurer that measures an output voltage of said adder; and
    an error determiner that determines an error of the quadrature modulation based upon a measurement result of said output voltage measurer.

2. The quadrature modulation apparatus according to claim 1, wherein said error determiner measures the error of the quadrature modulation based upon a relationship of the output voltage of said adder with respect to the phase of the in-phase correction signal or the quadrature correction signal.

3. The quadrature modulation apparatus according to claim 1, wherein said error determiner determines an error relating to an amplitude, an orthogonality, and an offset of the in-phase user signal and the quadrature user signal.

4. A quadrature modulation method, comprising:
    generating an in-phase correction user signal by adding an in-phase user signal to an in-phase correction signal of a sinusoidal voltage;
    generating an in-phase offset user signal by adding an in-phase voltage signal to the in-phase correction user signal;
    outputting an in-phase conversion signal by mixing an in-phase local signal of a predetermined local frequency with the in-phase offset user signal;
    generating a quadrature correction user signal by adding a quadrature user signal to a quadrature correction signal, which is different in phase by approximately 90 degrees from the in-phase correction signal;
    generating a quadrature offset user signal by adding a quadrature voltage signal to the quadrature correction user signal;
    outputting a quadrature conversion signal by mixing a quadrature local signal, which is different in phase by approximately 90 degrees from the in-phase local signal, with the quadrature offset user signal;
    adding the in-phase conversion signal to the quadrature conversion signal;
    measuring an output voltage of the added signals; and
    determining an error of the quadrature modulation based upon the measured output voltage.

* * * * *